(12) United States Patent
Thormundsson et al.

(10) Patent No.: US 10,701,484 B2
(45) Date of Patent: Jun. 30, 2020

(54) NON-LINEAR FEEDBACK CONTROL FOR TEMPERATURE AND POWER PROTECTION OF LOUDSPEAKERS

(71) Applicant: SYNAPTICS INCORPORATED, San Jose, CA (US)

(72) Inventors: Trausti Thormundsson, Irvine, CA (US); Govind Kannan, Irvine, CA (US); Harry Lau, Cerritos, CA (US); Mark Edward Miller, Mission Viejo, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/933,347

(22) Filed: Mar. 22, 2018

(65) Prior Publication Data

US 2018/0279044 A1 Sep. 27, 2018

Related U.S. Application Data

(60) Provisional application No. 62/475,100, filed on Mar. 22, 2017.

(51) Int. Cl.
*H04R 3/00* (2006.01)
*G10L 19/00* (2013.01)
*H03G 3/00* (2006.01)
*H03G 3/30* (2006.01)
*H04R 29/00* (2006.01)

(52) U.S. Cl.
CPC .............. *H04R 3/007* (2013.01); *G10L 19/00* (2013.01); *H03G 3/005* (2013.01); *H03G 3/30* (2013.01); *H03G 3/3005* (2013.01); *H04R 29/001* (2013.01)

(58) Field of Classification Search
CPC ....... H04R 3/007; H04R 29/001; G10L 19/00; H03G 3/007
See application file for complete search history.

(56) References Cited

U.S. PATENT DOCUMENTS

| 8,983,092 | B2 | 3/2015 | Thormundsson et al. |
| 9,654,866 | B2 | 5/2017 | Kannan et al. |
| 9,729,986 | B2 | 8/2017 | Crawley et al. |
| 9,837,971 | B2 | 12/2017 | Luo et al. |
| 9,900,690 | B2 | 2/2018 | Risberg et al. |
| 2004/0178852 | A1* | 9/2004 | Neunaber ................. H03F 1/52 330/284 |
| 2013/0077796 | A1* | 3/2013 | Risbo .................. H03G 11/008 381/55 |

(Continued)

*Primary Examiner* — Sonia L Gay
(74) *Attorney, Agent, or Firm* — Haynes and Boone, LLP

(57) ABSTRACT

A system and a method provide for protecting a loudspeaker from thermal and/or mechanical failure by monitoring for over-temperature and over-power conditions. The system generates a first gain from a first speaker protection controller in response to a driving voltage and/or a driving current of a loudspeaker, and generates a second gain from a second speaker protection controller in response to the driving voltage and/or a driving current of the loudspeaker, if the temperature exceeds a thermal limit or if the power exceeds a maximum power. The system applies the second gain to an audio signal to lower the audio signal if the first speaker protection controller fails.

20 Claims, 9 Drawing Sheets

(56) References Cited

U.S. PATENT DOCUMENTS

| | | |
|---|---|---|
| 2017/0235543 A1* | 8/2017 | England .................. G06F 3/165 700/94 |
| 2017/0245079 A1 | 8/2017 | Sheen et al. |
| 2017/0277607 A1* | 9/2017 | Samii .................. G06F 11/1658 |
| 2018/0152785 A1* | 5/2018 | Yeoh ..................... H03F 1/0216 |

* cited by examiner

NON-LINEAR FEEDBACK CONTROL FOR TEMPERATURE AND POWER PROTECTION OF LOUDSPEAKERS

CROSS-REFERENCE TO RELATED APPLICATIONS

This application claims the benefit of and priority to U.S. Provisional Patent Application No. 62/475,100 filed Mar. 22, 2017, and entitled "NON-LINEAR FEEDBACK CONTROL FOR TEMPERATURE AND POWER PROTECTION OF LOUDSPEAKERS," which is incorporated herein by reference in its entirety.

TECHNICAL FIELD

Various embodiments of the present disclosure relate generally to the protection of loudspeakers and more particularly, for example, to systems and methods for temperature and/or power protection of loudspeakers.

BACKGROUND

Loudspeakers have been widely used in consumer electronic devices for many years. There is a strong drive in the industry towards making consumer electronic devices thinner and smaller, including loudspeakers designed to fit in smaller spaces. A drawback of many smaller loudspeakers is a reduced acoustic output that they can deliver. In order to deliver more loudness or volume through the loudspeaker, the loudspeakers are driven closer to their designed thermal and/or mechanical limits, which can potentially lead to catastrophic loudspeaker failures if the limits are exceeded. In view of the foregoing, there is a continued need for improvements in systems and method for protecting loudspeakers.

SUMMARY

Systems and methods are disclosed herein for protecting a loudspeaker from thermal and/or mechanical failure by monitoring for over-temperature and over-power conditions. In one or more embodiments, a method comprises generating a first gain from a first speaker protection controller in response to a driving signal of a loudspeaker, wherein the first gain reduces the driving signal when the driving signal exceeds a loudspeaker operational threshold, applying the first gain to the driving signal to protect the loudspeaker during operation, generating a second gain from a second speaker protection controller in response to the driving signal of the loudspeaker, detecting a failure of the first speaker protection controller, and applying the second gain to the driving signal to protect the loudspeaker during operation when the failure of the first speaker protection controller is detected.

In various embodiment, the method further comprises generating the first gain using the first speaker protection controller by computing a temperature of the loudspeaker based on the driving signal, comparing the computed temperature of the loudspeaker with a maximum temperature of the loudspeaker to determine a first error value, and generating the first gain when the first error value is negative. A negative first error value may be indicative of an over-temperature condition of the loudspeaker. The method may further comprise generating the first gain, using the first speaker protection controller, by computing a power of the loudspeaker based on the driving signal, comparing the power of the loudspeaker with a maximum power of the loudspeaker to determine a second error value, and generating the first gain when the second error value is negative.

In some embodiments, the gains are generated by one or more proportional-integral-derivative (PID) controllers, which may be implemented in software or hardware. In some embodiments, the method may further comprise measuring a voltage of the driving signal, wherein the first gain and the second gain are generated in response to the measured voltage, and/or measuring a current of the driving signal, wherein the first gain and the second gain generated in response to the measured current.

In various embodiments, a system comprises a memory storing instructions for a first speaker protection controller to generate a first gain to protect a loudspeaker during operation, and a processor coupled to the memory and operable to execute the instructions to cause the system to perform operations comprising receiving a driving voltage of the loudspeaker, including computing a temperature of the loudspeaker based on the driving voltage, comparing the temperature of the loudspeaker with a maximum temperature of the loudspeaker to determine an error value, and generating the first gain if the error value is negative. The system may further comprise a second speaker protection controller configured to generate a second gain in response to the driving voltage of the loudspeaker, and a detector configured to receive the first gain and the second gain, apply the first gain to an audio output signal when the first speaker protection controller is operable, and apply the second gain to the audio output signal when a failure is detect in the first speaker protection controller. The system may further comprise a voltage measurement component operable to measure the driving voltage of the loudspeaker, In some embodiments, the processor is further operable to execute the instructions to cause the system to perform operations comprising computing a power of the loudspeaker based on a driving current of the loudspeaker, and comparing a power of the loudspeaker with a maximum power of the loudspeaker.

In various embodiments, the second speaker protection controller further comprises a proportional-integral-derivative (PID) controller and may be implemented in hardware. In some embodiments, the second speaker protection controller is further operable to compute the temperature of the loudspeaker based on the driving voltage, compare the temperature of the loudspeaker with a maximum temperature of the loudspeaker to determine an error value, and generate the second gain in response to a negative error value. In some embodiments, the second speaker protection controller is further operable to compute a power of the loudspeaker based on the driving voltage, compare the power of the loudspeaker with a maximum power of the loudspeaker to determine an error value, and generate the second gain in response to a negative error value.

The scope of the disclosure is defined by the claims, which are incorporated into this section by reference. A more complete understanding of embodiments of the present disclosure will be afforded to those skilled in the art, as well as a realization of additional advantages thereof, by a consideration of the following detailed description of one or more embodiments. Reference will be made to the appended sheets of drawings that will first be described briefly.

Figure 1:
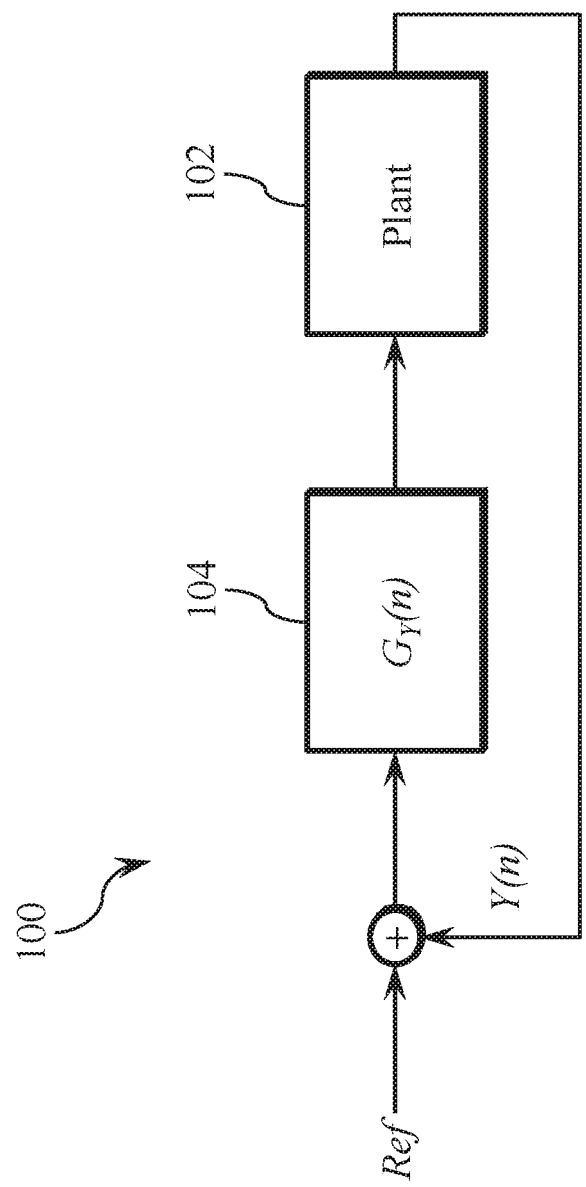
FIG. 1 is an exemplary feedback control system for loudspeaker protection, in accordance with one or more embodiments of the present disclosure.

Embodiments of the present disclosure and their advantages are best understood by referring to the detailed description that follows. It should be appreciated that like reference numerals are used to identify like elements illustrated in one or more of the figures, wherein showings therein are for purposes of illustrating embodiments of the present disclosure and not for purposes of limiting the same.

DETAILED DESCRIPTION

The present disclosure describes embodiments for protecting against thermal failures and/or excessive power failures during loudspeaker operation. In various embodiments, the thermal and mechanical state of a loudspeaker is determined by measuring the voltage and current driving the loudspeaker (i.e., driving voltage and driving current), and control systems are implemented to limit the driving signal (determined by voltage and current) so that the loudspeaker is protected against thermal and mechanical failures.

Generally, a loudspeaker is an electrostatic transducer that converts an electric audio signal into a corresponding acoustic audio signal. In a conventional implementation, a loudspeaker includes a voice coil that carries current when the loudspeaker is in operation. A magnetic field is generated around the voice coil from the electric current, which displaces a diaphragm, thus causing it to move back and forth. This movement creates a pressure waveform that translates to an audible sound that can be heard by a person. The loudspeaker may fail if the voice coil or any components supporting the voice coil becomes damaged. For example, excessive heat may short and burn the voice coil or components of the voice coil if too much current is driven through the voice coil due to Joule heating ($I^2R$). The loudspeaker may also fail if the adhesive used to hold the voice coil in place melts, again, due to excessive heat from excessive current, thus causing the voice coil to become detached.

In various embodiments, a loudspeaker may be operated close to its designed temperature limit in order to maximize performance. The operational temperature limit of the loudspeaker may be used to protect the loudspeaker from over-temperature conditions. The temperature limit may be provided by a manufacture, but often it is not known. The temperature limit may be determined by gradually allowing a loudspeaker to reach an over temperature condition while monitoring the driving current and the driving voltage of the loudspeaker. As explained in the below equations, the loudspeaker may be modeled as an electroacoustic transducer to determine its temperature limit based on the driving current and the driving voltage when the loudspeaker reaches the thermal limit.

The loudspeaker can be modeled as an electroacoustic transducer which generates a pressure waveform p(t), or p(f) in frequency domain. Here, p(f) is a function of a displacement transfer function $H_x(f)$ and the driving voltage signal v(f). In free-field, the relationship is given by:

$$p(f) = \frac{2\pi\rho f^2}{r} S_D H_x(f) v(f), \tag{1}$$

where $S_D$, $\rho$, and r, are area of the diaphragm, density of air, and distance from the diaphragm, respectively.

Let i(t) be the current waveform due to the voltage v(t), $Z_T(f)$ be the impedance of the loud-speaker where T is the temperature, and $R(T)=Z_T(0)$ be the DC resistance. The real power delivered to the loudspeaker $P_r(t)$ can be computed by measuring the v(t) and i(t) as follows:

$$P_r(t) = \frac{1}{\tau}\int_{t-\tau}^{t} v(t)i(t)dt, \tag{2}$$

where $\tau$ is the averaging period. Given an ambient temperature $T_0$ at which the DC resistance $R(T_0)$ (e.g., speaker impedance) is known, the temperature T of the voice coil can be estimated by:

$$T = T_o + \frac{1}{\alpha}\left(\frac{R(T)}{R(T_0)} - 1\right), \tag{3}$$

where $\alpha$ is the temperature coefficient of resistance. The DC resistance R(T) can be measured by injecting a low frequency pilot tone at a frequency $f_p$ along with the voltage waveform and estimating:

$$R(T) = \frac{v(f_p)}{i(f_p)}, \tag{4}$$

Based on the above model for a loudspeaker, an objective in tuning a playback processing chain is to maximize sound pressure level (SPL) output within constraints of the loudspeaker's limit. That is, maximize P(f), such that:

$$x(t) < X_{max} \tag{5}$$

$$T(t) < T_{max} \tag{6}$$

$$P_r(t) < P_{max} \tag{7}$$

where $X_{max}$, $T_{max}$, $P_{max}$ are the rated limits of displacement, temperature, and power, respectively. Therefore, the temperature and the power limits of the loudspeaker can be determined by measuring current i(t) and voltage v(t) using equations (3) and (2). The loudspeaker can be modeled as a process wherein the input is the voltage and the output is either the power or the temperature.

FIG. 1 illustrates an exemplary feedback control system 100 that may be used to control temperature or power of a loudspeaker. As illustrated, a loudspeaker may be modeled as a plant 102 having an input voltage and an output that is power or temperature. Here, Ref is the desired or maximum rated temperature or power value. A feedback signal Y(n) that is representative of temperature or power is applied to Ref and a gain $G_Y(n)$ is generated based on the applied feedback Y(n). The gain $G_Y(n)$ is applied to the loudspeaker and an output that is corrected by the gain $G_Y(n)$ is generated from the loudspeaker.

Loudspeaker protection using the feedback control system 100 of FIG. 1 may be solved using a variety of methods. For example, once the power or temperature threshold is breached, a series of attenuation may be applied in fixed small increments until the power or temperature returns below a set point. However, such simple control schemes may be tedious and too slow in limiting sudden transients and it may lead to oscillatory behavior if the time constant cannot keep up with the system dynamics. Furthermore, simple control schemes may need aggressive tuning and/or may be difficult to tune, which in turn, can limit the ability to achieve maximum loudness. The present disclosure describes improved feedback control systems.

Figure 2:
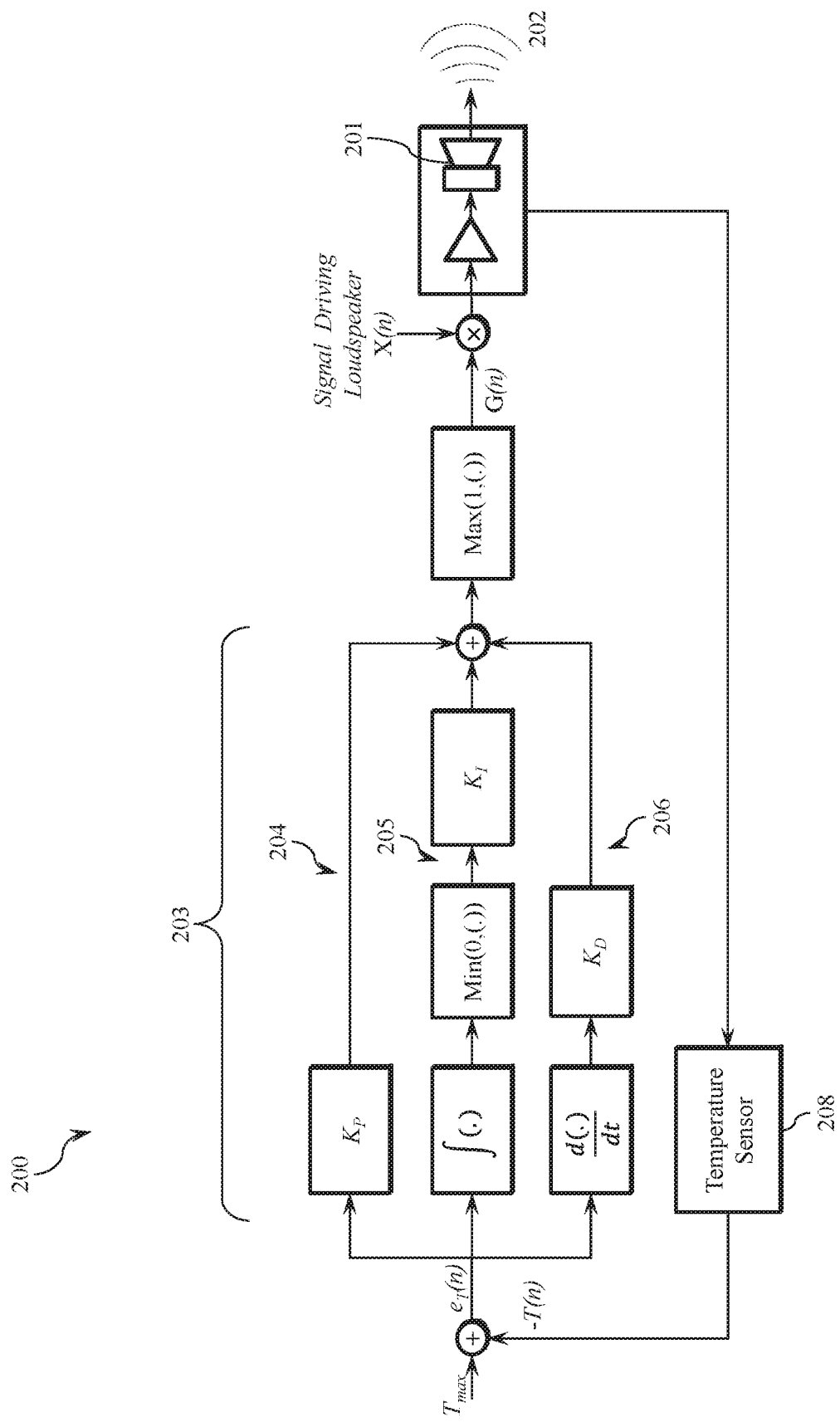
FIG. 2 is an exemplary feedback control system for protecting a loudspeaker from exceeding thermal limits, according to one or more embodiments of the present disclosure.

FIG. 2 illustrates a feedback control system 200 for protecting a loudspeaker 201 from exceeding its thermal limits, according to one or more embodiments of the present disclosure. The feedback control system 200 implements a modified proportional-integral-derivative (PID) controller 203 to protect the loudspeaker 201 from exceeding its thermal limits. When the temperature of the loudspeaker 201 exceeds its thermal limit, the PID controller 203 reduces the gain on the loudspeaker 201 to lower the temperature of the loudspeaker 201 below the thermal limit. When the temperature of the loudspeaker 201 is below its thermal limit (also referred to as "maximum temperature"), temperature-based adjustments are not required. In various embodiments, the PID controller 203 may also be operable to make other changes to the signal based on other factors other than temperature.

As illustrated, $T_{max}$ represents an operational temperature above which the voice coil or other components inside the loudspeaker 201 may experience a catastrophic failure (i.e., thermal limit). In order to prevent damages to the voice coil or the adhesive of the loudspeaker 201, for example, it is desirable to maintain the temperature of the voice coil below $T_{max}$. If the temperature of the voice coil exceeds $T_{max}$, then the voice coil may short and burn, and/or the adhesive holding the voice coil may melt, thus causing the voice coils to detach.

The value T(n) is a measured temperature of the loudspeaker 201 as determined by a temperature sensor 208. An error $e_T(n)$ is determined as a difference between $T_{max}$ and T(n), such that $e_T(n)=T_{max}-T(n)$. The error $e_T(n)$ is then provided to the PID controller 203 to generate a gain G(n), which is combined with a driving signal X(n) (e.g., an audio signal to be played through the loudspeaker 201) to drive the loudspeaker 201. According to an embodiment, the PID controller 203 is operable to implement a corrective action to protect the loudspeaker 201 from a thermal failure by lowering the gain G(n) when the error $e_T(n)$ is less than zero (i.e., a negative value). Otherwise, as long as the measured temperature T(n) is less than $T_{max}$, error $e_T(n)$ is a positive value and no corrective action is required by the PID controller 203.

In the exemplary embodiment, the PID controller 203 includes three sections: a proportional (P) section 204, an integral (I) section 205, and a derivative (D) section 206. The output from each of the three sections are summed together to achieve a net gain, which is referred to as G(n). The proportional section 204 is operable to multiply the error $e_T(n)$ by a value $K_P$ to generate a value that is proportional to $e_T(n)$. The integral section 205 is operable to integrate the error $e_T(n)$ and multiply the integrated term by a value $K_I$ to generate a value that is integrated over a period of time. The derivative section 206 is operable to take a derivative of the error $e_T(n)$ and multiply the derived term by $K_D$ to generate a value that is a derivative of the error $e_T(n)$.

In the illustrated embodiment, the integral section 205 of the PID controller 203 is operable to protect the loudspeaker 201 by performing a non-linear limiting function. For example, when $e_T(n)<0$, the measured temperature T(n) has exceeded the temperature $T_{max}$. In response, the feedback control system 200 lowers the temperature by lowering the driving signal to the loudspeaker 201. The output from the integral section 205 may be summed together with the outputs from the proportional section 204 and/or the derivative section 206 to generate a new lower gain G(n) value. The integral section 205 may be configured to take no corrective action due to temperature when $e_T(n)>0$. In some embodiments, the value of gain G(n) may be limited to be within 0 to 1, and is combined with driving signal X(n) to provide an updated driving signal to the loudspeaker 201. In this manner, the loudspeaker 201 can be safely operated and if the temperature begins to exceed the thermal limit, then the feedback control system 200 can automatically lower the temperature by lowering the gain G(n) for the driving signal.

In some embodiments, the PID controller 203 uses all three P-I-D sections (204, 205 and 206, respectively). In other embodiments, the PID controller 203 may use just one or two of the P-I-D sections such as only I or P-I sections. In some embodiments, the values of $K_P$, $K_I$, and $K_D$ may be determined experimentally based on the characteristics of power amplifiers and speaker driver to achieve desired results from the P-I-D controller 203.

Figure 3:
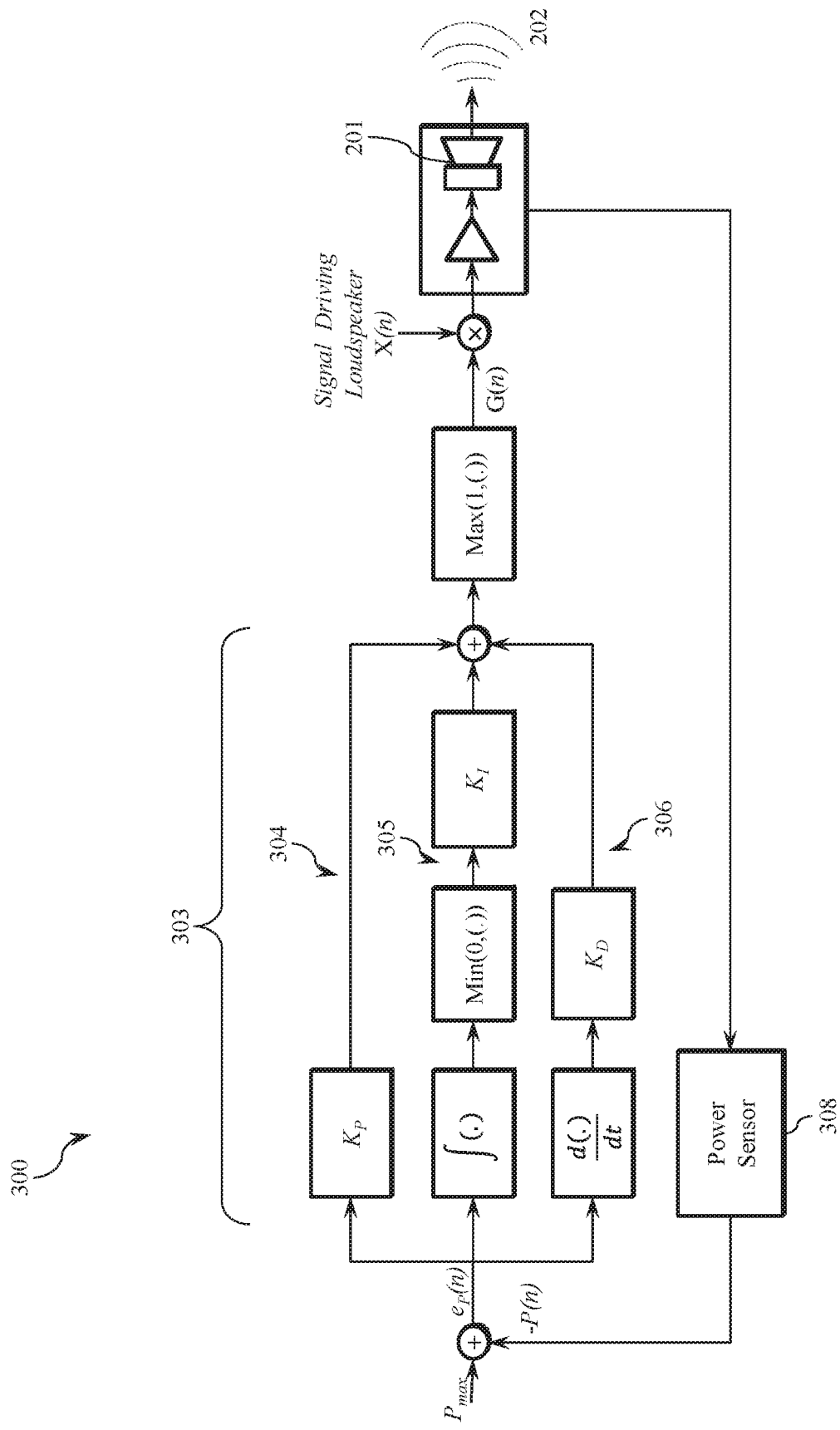
FIG. 3 is an exemplary feedback control system for protecting a loudspeaker from exceeding power limits, according to one or more embodiments of the present disclosure.

FIG. 3 illustrates a feedback control system 300, according to one or more embodiments of the present disclosure, for protecting the loudspeaker 201 from exceeding its power limits in an arrangement that is similar to the feedback control system 200 illustrated in FIG. 2. This feedback control system 300 implements a similar proportional-integral-derivative (PID) controller 303 to maintain the loudness 202 if the power of the loudspeaker 201 is within the power limits and also protects the loudspeaker 201 from exceeding its power limits.

As illustrated, $P_{max}$ (also referred to as "maximum power") represents the power above which the voice coil or other components inside the loudspeaker 201 may experience a catastrophic failure (i.e., power limit). That is, in order to prevent damage to the loudspeaker 201, the power being driven to the loudspeaker 201 may be maintained below the power limit $P_{max}$. If the power exceeds the power limit $P_{max}$, components of the loudspeaker 201 such as the voice coil may short and burn, and/or the adhesive holding the voice coil may melt, thus causing the voice coils to become detached.

The value P(n) is the power sensed at the loudspeaker 201 as determined by a power sensor 308. An error $e_p(n)$ is determined as a difference between $P_{max}$ and P(n), such that $e_p(n)=P_{max}-P(n)$. The error $e_p(n)$ is then provided to the PID controller 303 to generate a gain G(n), which is combined with the driving signal X(n) to drive the loudspeaker 201. According to an embodiment, the PID controller 303 is operable to take corrective action to protect the loudspeaker 201 from a thermal or mechanical failure by lowering the gain G(n) when the error $e_p(n)$ is less than zero (i.e., a negative value). When the measured power P(n) is less than $P_{max}$, error $e_p(n)$ is a positive value and no corrective action needs to be taken by the PID controller 303.

In the illustrated embodiment, the PID controller 303 includes three sections: a proportional (P) section 304, an integral (I) section 305, and a derivative (D) section 306. The output from each of the three sections are summed together to achieve a net gain G(n). The proportional section 304 is operable to multiply the error $e_p(n)$ by the value $K_P$ to generate a value that is proportional to $e_p(n)$. The integral section 305 is operable to integrate the error $e_p(n)$ and multiply the integrated term by $K_I$ to generate a value that is integrated over a period of time. The derivative section 306 is operable to take a derivative of the error $e_p(n)$ and multiply the derived term by $K_D$ to generate a value that is a derivative of the error $e_p(n)$. In some embodiments, the integral section 305 of the PID controller 303 is operable protect the loudspeaker 201 by performing a non-linear limiting function. For example, when $e_p(n)<0$, the measured power P(n) has exceeded the power limit $P_{max}$. In response, the feedback control system 300 lowers the power by lowering the driving signal provided to the loudspeaker 201. The output from the integral section 305 may be summed together with the outputs from the proportional section 304 and/or the derivative section 306 to generate a new lower gain G(n). The integral section 305 may be configured to take no corrective action due to the power level when $e_p(n)>0$. In some embodiments, the value of gain G(n) may be limited to be within 0 to 1, and is combined with driving signal X(n) to provide an updated driving signal to the loudspeaker 201. In this manner, the loudspeaker 201 can be safely operated and if the power begins to exceed the power limit, then the feedback control system 300 can automatically lower the power by lowering the gain on the driving signal, thereby lowering the temperature.

In some embodiments, the PID controller 303 uses all three P-I-D sections. In other embodiments, the PID controller 303 may use just one or two of the P-I-D sections such as only I or P-I sections. In some embodiments, the values of $K_P$, $K_I$, and $K_D$ may be determined experimentally based on the characteristics of power amplifiers and speaker driver to achieve desired results from the P-I-D controller 303.

The various techniques for protecting a loudspeaker as provided herein may be implemented in a number of different manners. Many consumer electronic devices have general purpose processors and operating systems and are capable of performing computationally intensive tasks, which may be a small fraction of the total potential of such processors and operating systems. Thus, in some embodiments, the feedback control systems computations described above with reference to FIGS. 2 and 3 may be performed as a set of instructions stored in a computer memory and configured to be executed by a computer processor and further configured to retrieve measured current and voltage samples for computation.

In some embodiments, voltage and current measurement circuits may be included in an audio codec and provided to the computer executable instructions running on a host processor. In such case, the processor may perform feedback control system calculations and adjust the playback stream. Incorporating speaker protection in a computer or system level device allows for tighter integration with loudness boosting algorithms and flexibility for parameter tuning. However, general purpose processors or the software ecosystem may not provide sufficient reliability for certain applications, and in some cases might crash when executing the instructions, often times due to the operating system or due to system integration issues, the results which can be catastrophic to a loudspeaker. Thus, according to various embodiments, a speaker protection system including a PID controller as described herein may be implemented in a hardware configuration that is triggered if the computer processor fails.

Figure 4:
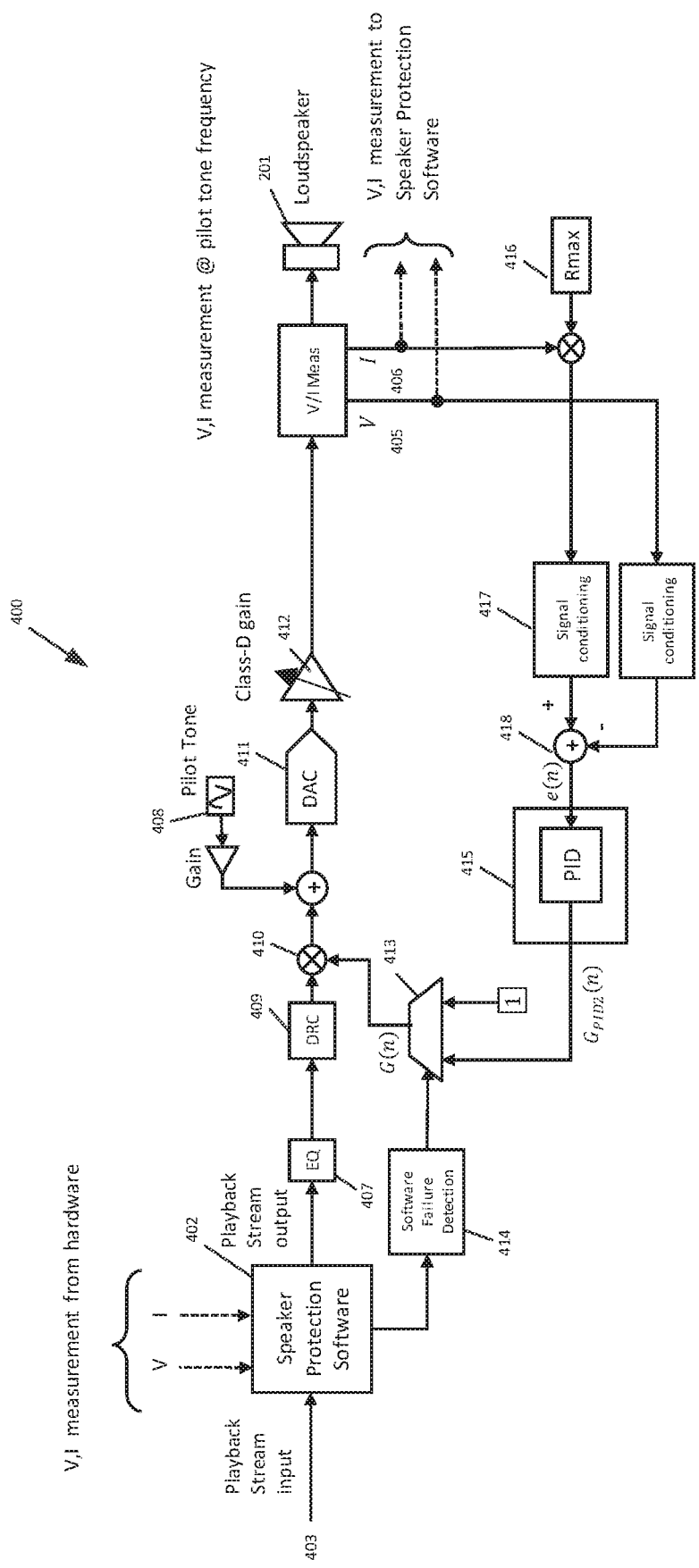
FIG. 4 is an exemplary hybrid loudspeaker protection system, according to one or more embodiments of the present disclosure.

FIG. 4 illustrates an exemplary implementation of a speaker protection system arranged in a hybrid configuration ("hybrid system 400") having both a hardware speaker protection system and a software speaker protection system for protecting a loudspeaker from thermal and mechanical failure by monitoring over-temperature conditions based on techniques similar to those illustrated in FIG. 2 of the present disclosure.

According to an embodiment, a hybrid system 400 includes a primary method and a secondary (backup) method for protecting the loudspeaker 201 from an over-temperature condition. Both methods use a PID controller technique similar to the one described with reference to FIG. 2 to protect the loudspeaker 201 from thermal failure due to over-temperature conditions. Furthermore, while one method is referred to herein as the primary method and the other method is referred to as the secondary method, in some embodiments, the secondary method may be the primary method and the primary method may be the secondary method.

In the illustrated embodiment, in the primary method the PID controller is implemented as a first speaker protection controller 402 (e.g., built-in to an audio codec as a set of instructions). The instructions may be stored in a memory and executed by an onboard processor of the host electronic device. As illustrated, an audio signal 403 (e.g., an audio stream) is provided to the first speaker protection controller 402 and if the level of the audio signal is determined to cause the temperature of the loudspeaker 201 to exceed its maximum temperature, then the first speaker protection controller 402 is operable to generate a first gain $G_{PID1}(n)$ to reduce the level of the audio signal 403 before sending the audio signal to the loudspeaker 201. If the first speaker protection controller 402 determines that the temperature of the loudspeaker 201 is below a maximum temperature determined for loudspeaker 201, then the audio signal 403 is provided to the loudspeaker 201 without reducing the gain due to the temperature.

The temperature of the loudspeaker 201 may be determined by obtaining a measurement of a driving voltage 405 and a measurement of a driving current 406 from the loudspeaker 201 and providing them to the first speaker protection controller 402. The temperature may be computed by applying the driving voltage 405 and the driving current 406 to equations (1)-(4) above. Based on the temperature T(n) computed from measurements of the driving voltage 405 and the driving current 406 of the loudspeaker 201, an error $e_T(n)$ may be determined by comparing the computed temperature T(n) with the maximum temperature $T_{max}$ that is predetermined as explained earlier with reference to FIG. 2. Accordingly, the PID controller of the first speaker protection controller 402 may generate the first gain $G_{PID1}(n)$ based on the error $e_T(n)$ and apply the first gain to the audio playback stream at 410.

A software failure detector 414 determines whether or not the first speaker protection controller 402 is operating correctly, such as by using a watchdog timer mechanism (e.g., a timer that is reset periodically by the host processor and which detects a failure after a timeout event). If the failure detector 414 determines that the first speaker protection controller 402 is functioning correctly, then the first gain $G_{PID1}(n)$ generated by the first speaker protection controller 402 is applied to the playback stream. In the illustrated embodiment, $G_{PID1}(n)$ is applied by the speaker protection controller 402 software and is not explicitly shown in FIG. 4.

A second speaker protection controller 415 may be implemented using hardware and is operable to generate a second gain $G_{PID2}(n)$. If the failure detector 414 determines that the first speaker protection controller 402 is not functioning correctly, then the failure detector 414 switches the multiplexer 413 to the second gain $G_{PID2}(n)$. In this embodiment, the multiplexer 413 has a constant gain of 1 at one of the other multiplexer inputs. Therefore, when desired (e.g., when software failure has not been detected or when selected by a user), the second speaker protection feature may be turned off by selecting the constant gain of 1 by the multiplexer 413 so that the gain does not change the level of the audio signal 403.

Turning back to the second speaker protection controller 415, the error $e_T(n)$ between a measured temperature $T(n)$ of the loudspeaker 201 and the maximum temperature $T_{max}$ may be determined by measuring the driving voltage 405 and the driving current 406 of the loudspeaker 201. Since $e_T(n)=T_{max}-T(n)$, in order to maintain the temperature of the loudspeaker 201 below the maximum temperature, $T(n)$ should be less than $T_{max}$. Furthermore, because the resistance ($R_{max}$) of the loudspeaker 201 is directly proportional to the temperature of the loudspeaker 201, let $IR<IR_{max}$. Therefore, $V<IR_{max}$. Accordingly, resistance $R_{max}$ 416 of the loudspeaker 201 (which may be known or predetermined) may be multiplied by the measurement of the driving current 406 to determine a voltage value in which the driving voltage 405 should remain below. This voltage value (after passing through a signal conditioner 417) may be compared at 418 with the measured driving voltage 405 to determine the error $e_T(n)$. Accordingly, $e_T(n)$ may be applied to the PID controller of second speaker protection controller 415 to generate the second gain $G_{PID2}(n)$, which is then provided to the multiplexer 413. Thus, the multiplexer 413 receives the second gain $G_{PID2}(n)$ from the second speaker protection controller 415 and the constant gain of 1.

In the illustrated embodiment, the audio signal 403 output from the first speaker protection controller 402 is provided to an equalizer 407, passed through dynamic range compression 409, and multiplied at 410 by the gain $G(n)$ provided from the multiplexer 413. The gain $G(n)$ compensated audio signal is combined with a pilot tone 408. As explained earlier with reference to equation (4), the pilot tone is a low level low frequency signal (e.g., inaudible tone at 82 Hz) that is injected to the audio signal so that it can be used to compute the resistance of the loudspeaker 201. Next, the pilot tone injected audio signal is passed through a digital to analog converter (DAC) 411 and a Class-D amplifier 412, and provided to the loudspeaker 201, where the audio signal is converted to an audible waveform. In this manner, the hybrid system 400 is able to protect the loudspeaker 201 from over-temperature thermal conditions by providing two separate methods of determining and generating a gain to affect the audio signal level.

In the above description the first speaker protection controller 402 is the primary speaker protection controller. In alternative embodiments, the second speaker protection controller 415 may be configured to operate as the primary speaker protection controller, while the first speaker protection controller 402 may be configured as the backup speaker protection controller. In such embodiments, the failure detector 414 may monitor whether the second gain $G_{PID2}(n)$ from the second speaker protection controller 415 is within an expected operational range, and if it determines that the second gain $G_{PID2}(n)$ is out of range, then it may determine that the second speaker protection controller 415 is not functioning properly and switch to the first gain $G_{PID1}(n)$ from the first speaker protection controller 402.

Figure 5:
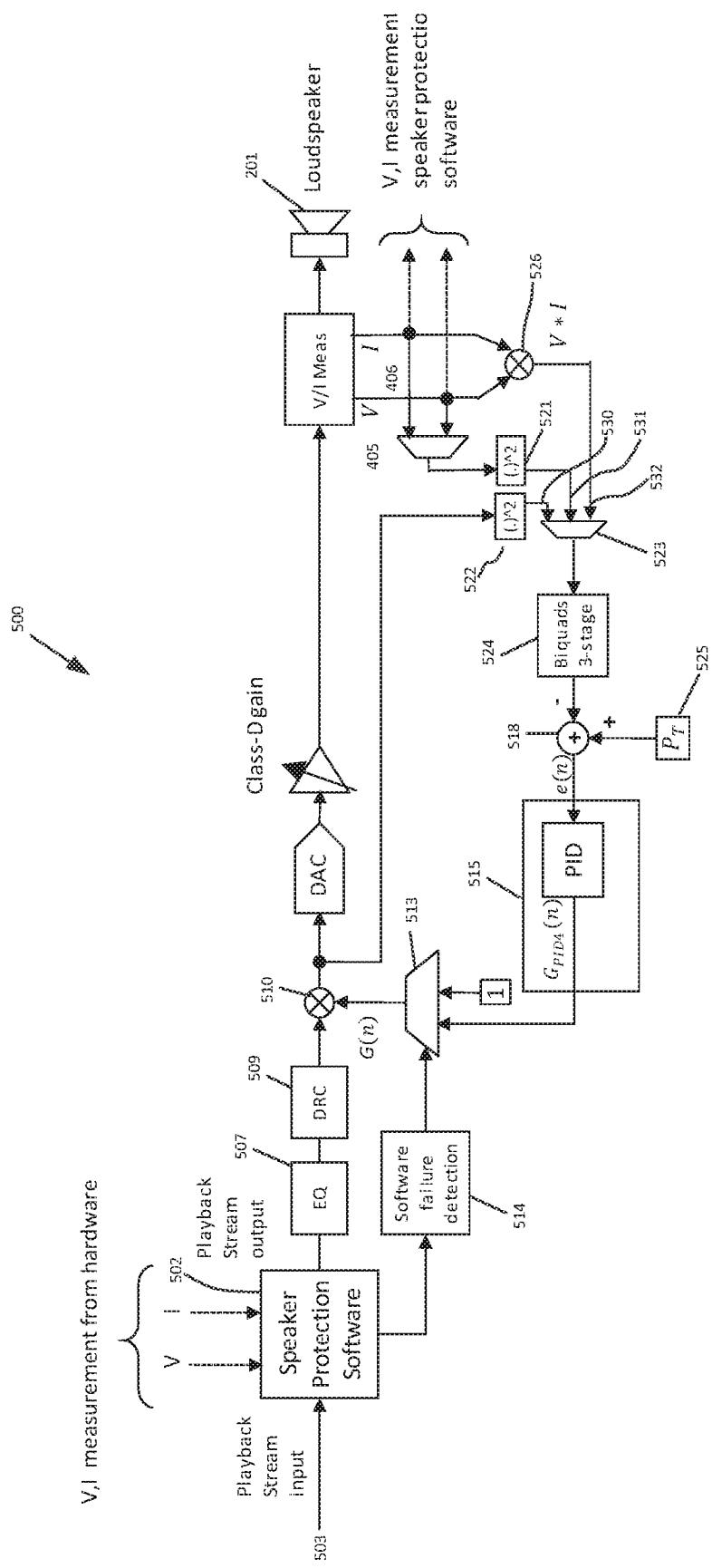
FIG. 5 is an exemplary hybrid loudspeaker protection system, according to one or more embodiments of the present disclosure.

FIG. 5 illustrates a block diagram of another exemplary implementation of a speaker protection system arranged in a hybrid configuration ("hybrid system 500") having both a hardware speaker protection system and a computer executable instructions speaker protection system for protecting the speaker from thermal and mechanical failure by monitoring over-power conditions based on techniques similar to those illustrated in FIG. 3 of the present disclosure. Many features of hybrid system 500 are similar to the features of hybrid system 400, except that hybrid system 500 monitors for over-power conditions and hybrid system 400 monitors for over-temperature conditions. For example, components 507, 509, 510 and 518, correspond to components 407, 409, 410 and 418, respectively, of FIG. 4. Features that are the same in both systems and that are already explained with reference to FIG. 4 will not be explained again here.

The hybrid system 500 includes a primary method and a secondary (backup) method for protecting the loudspeaker 201 from an over-power condition. Both methods use a PID controller technique similar to the one described with reference to FIG. 3 to protect the loudspeaker 201 from the over-power condition. Furthermore, while one method is referred to herein as the primary method and the other method is referred to as the secondary method, in some embodiments, the secondary method may be the primary method and the primary method may be the secondary method.

According to the embodiment, a third speaker protection controller 502 and a fourth speaker protection controller 515 monitor the power level $P(n)$ of the audio signal 503 at the loudspeaker 201 by measuring a driving voltage 405 and a driving current 406 of the loudspeaker 201 and calculating power as a product of voltage and current ($P=VI$). The third speaker protection controller 502 uses the measurements of driving voltage 405 and driving current 406 to compute a measured power $P(n)$ at the loudspeaker 201. After the measured power $P(n)$ is determined, it is compared with the maximum power $P_{max}$ of the loudspeaker 201 and if the measured power $P(n)$ is greater than the maximum power $P_{max}$, then a third gain $G_{PIDS3}(n)$ is applied to the audio signal by the third speaker protection controller 502. In some embodiments, the third speaker protection controller 502 may include a PID controller similar to the one described in FIG. 3.

According to an embodiment of the present disclosure, a fourth speaker protection controller 515 may be implemented using hardware and may be configured to generate a fourth gain $G_{PID4}(n)$ based on a comparison between a measured power $P(n)$ of the loudspeaker 201 and the maximum power $P_{max}$ 525. At 518, measured power is compared with the maximum power $P_{max}$ 525. If the measured power $P(n)$ is greater than the maximum power $P_{max}$ 525, then a negative error $e_P(n)$ is provided from 518 to the fourth speaker protection controller 515 where it generates a gain $G_{PID4}(n)$ that reduces the audio signal 503. If the measured power $P(n)$ is less than the maximum power $P_{max}$ 525, then a positive error $e_P(n)$ is provided from 518 to the fourth speaker protection controller 515 where the gain does not have to be changed because the measured power P(n) has not exceeded the maximum power $P_{max}$.

The software failure detector 514 determines whether or not the third speaker protection controller 502 is operating correctly, such as by using a watchdog timer mechanism. If the failure detector 514 determines that the third speaker protection controller 502 is functioning correctly, then the third gain $G_{PID3}(n)$ generated by the first speaker protection controller 502 is applied to the playback stream. If the failure detector 514 determines that the third speaker protection controller 502 is not functioning correctly, then the failure detector 514 switches the multiplexer 513 to the fourth gain $G_{PID4}(n)$. In this embodiment, the multiplexer 513 has a constant gain of 1 at one of the other multiplexer inputs. Therefore, when desired (e.g., when software failure has not been detected or when selected by a user), the fourth speaker protection feature may be turned off by selecting the constant gain of 1 by the multiplexer 513 so that the gain does not change the level of the audio signal 503.

In some embodiments, the measured power P(n) that is used to determine the error $e_P(n)$ for the fourth speaker protection controller 515 may be determined through various computations of measured voltages and/or current. In this embodiment, three different methods are provided to compute the measured power P(n). While only one method for computing the measured power P(n) is needed to determine the error $e_P(n)$, alternate methods are provided as redundancy in case one method fails to compute the measured power P(n). On the other hand, more than three methods may be provided to compute the measured power P(n) as additional measures to avoid failure.

According to a first method of determining the measured power P(n), the measurements of the driving voltage 405 and the driving current 406 may be multiplied at 526 to compute a first measured power $P_1(n)$ 532. The first measured power $P_1(n)$ may then be provided to a power multiplexer 523. According to a second method of determining the measured power P(n), the measurement of the driving voltage 405 may be squared at 521 to compute the power using the equation $P=V^2/R$, or the measurement of the driving current 406 may be squared at 521 to compute the power using the equation $P=I^2R$, to determine the second power value 531. It is noted that the value for R may be determined as $R_{max}$ (i.e., loudspeaker impedance) through manufacture specification or through the use of a pilot tone and equation (4) described earlier. Thus, using the known value of $R_{max}$, the second measured power $P_2(n)$ may be computed as either $P_2(n)=V^2/R$ or $P_2(n)=I^2R$ through the use of multiplexer 520 to select either the measurement of the driving voltage 405 or the measurement of the driving current 406. The second measured power $P_2(n)$ may then be provided to the power multiplexer 523. In some embodiments, it may be easier to compute the second power $P_2(n)$ using the equation $P_2(n)=V^2/R$ than the equation $P_2(n)=I^2R$ because the driving current 406 may be more difficult to measure from a loudspeaker compared to measuring the driving voltage 405.

In a laboratory environment, the driving current 406 may be easily measured but in an actual loudspeaker 201, measuring a current is more difficult because current is generally measured in series or determined through induced magnetic field. According to a third method, the measured power may be directly provided from the audio stream at 527 to provide the third power $P_3(n)$ 530 to the power multiplexer 523. In this manner, the measured power P(n) may be determined through three different methods and the power multiplexer 523 is operable to select one of the three measured powers.

The selected measured power P(n) is passed through a filter (e.g., a three-stage biquad filter 524) and provided to 518 for comparison with the maximum power $P_{max}$ 525.

Figure 6:
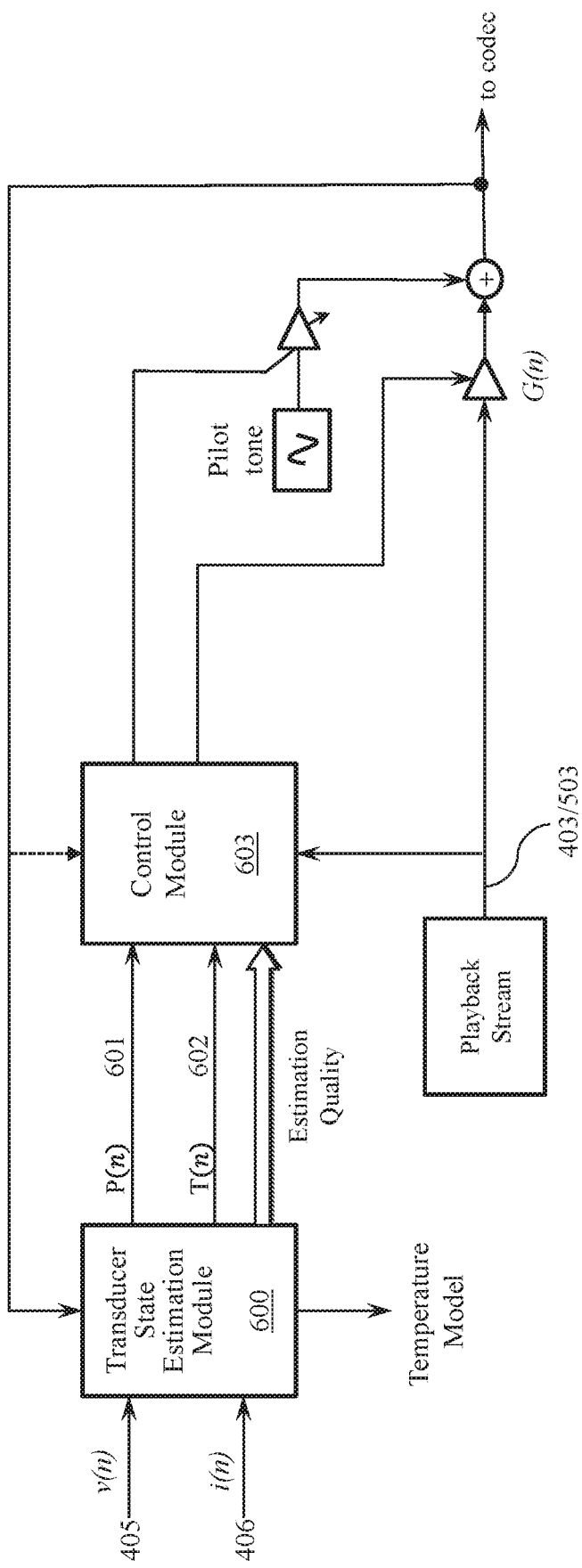
FIG. 6 is an exemplary speaker protection controller, according to one or more embodiments of the present disclosure.

FIG. 6 illustrates an exemplary implementation of the first speaker protection controller 402 illustrated in FIG. 4 or the third speaker protection controller 502 illustrated in FIG. 5. The first speaker protection controller 402 and the third speaker protection controller 502 may both use the same computer implemented set of instructions to monitor for both over-temperature and over-power conditions as desired.

As previously explained, a measurement of the driving voltage 405 and a measurement of the driving current 406 are provided to the first speaker protection controller 402 and the third speaker protection controller 502. In the first speaker protection controller 402 and the third speaker protection controller 502, a transducer state estimation module 600 receives a measurement of the driving voltage 405 and a measurement of the driving current 406 to compute the power P(n) 602 or the temperature T(n) 601 of the loudspeaker 201. Control module 603 receives the computed power P(n) 602 and computed temperature T(n) 601 to generate a gain $G_{PID1}(n)$ or $G_{PID3}(n)$. In some embodiments, the first speaker protection controller 402 and/or the third speaker protection controller may be implemented as a set of instructions in a memory, wherein the instructions are configured to be executed by a processor (e.g., a software code).

Figure 7:
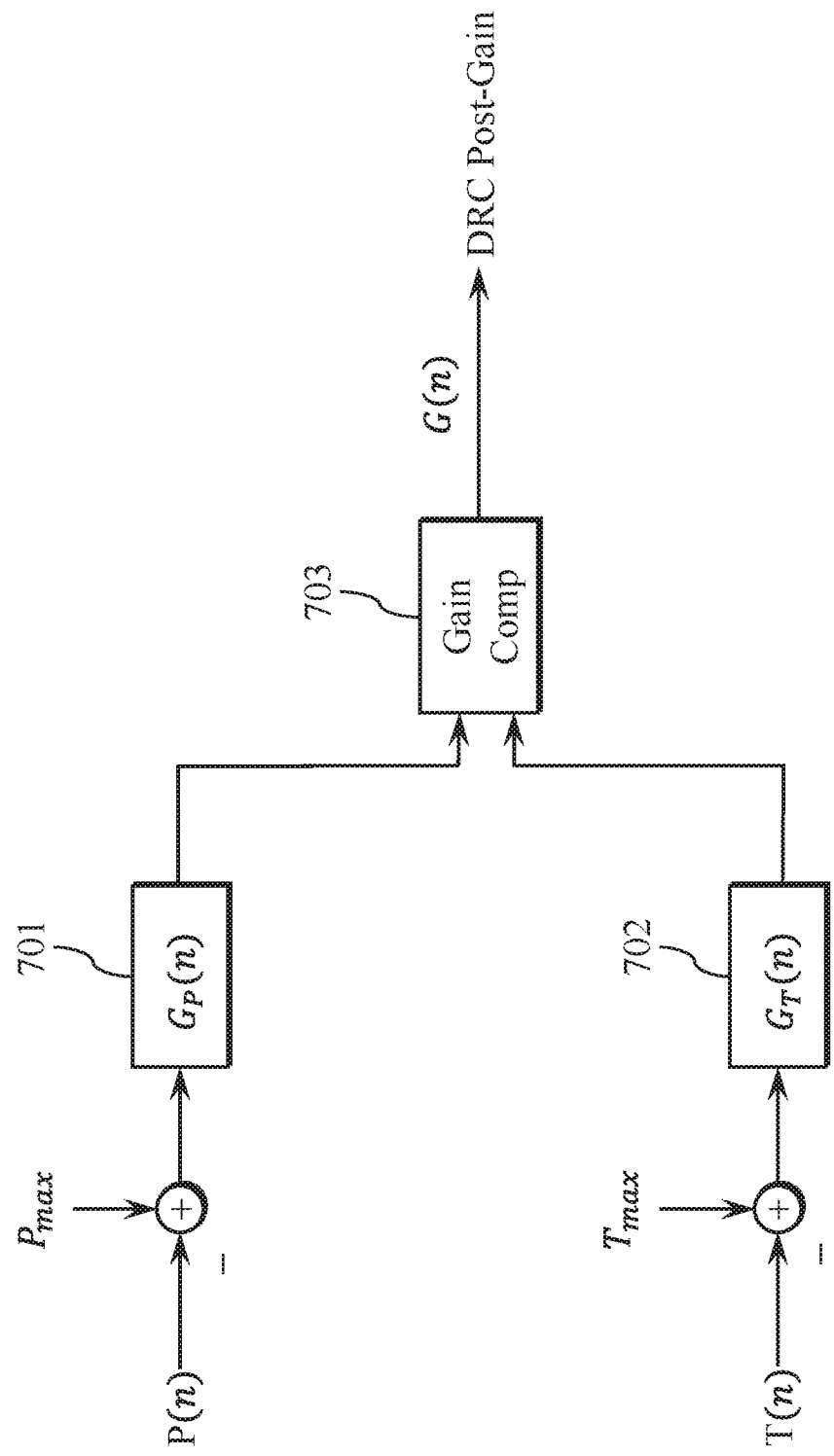
FIG. 7 is an exemplary control module, according to one or more embodiments of the present disclosure.

FIG. 7 illustrates an embodiment of the control module 603 illustrated in FIG. 6. According to an embodiment, the control module 603 includes a first PID controller 701 for monitoring temperature, similar to the PID controller described with reference to FIG. 2 and a second PID controller 702 for monitoring power, similar to the PID controller described with reference to FIG. 3. The first PID controller 701 receives a temperature error $e_T(n)$, which is determined as a difference between the maximum temperature $T_{max}$ and the measured temperature T(n) 601. The first PID controller 701 generates a gain $G_{PID2}(n)$ based on the error $e_T(n)$ and provides the gain $G_{PID2}(n)$ to a gain comparator 703. Similarly, the second PID controller 702 receives a power error $e_P(n)$, which is determined as a difference between the maximum power $P_{max}$ and the measured power P(n) 602. The second PID controller 702 generates a gain $G_{PID4}(n)$ based on the error $e_P(n)$ and provides the gain $G_{PID4}(n)$ to the gain comparator 703. The gain comparator 703 may be operable to output gain $G_{PID2}(n)$ or $G_{PID4}(n)$ to the multiplexer 413 or 513, depending on the configuration and the arrangement of the hybrid system 400 or 500. For example, if the hybrid system 400 or 500 is operable to monitor both power and temperature, then the gain comparator 703 may be operable to conservatively select the smaller gain out of $G_{PID2}(n)$ or $G_{PID4}(n)$ to ensure that the loudspeaker 201 is protected against both over-temperature and over-power conditions. In other embodiments, if the hybrid system 400 or 500 is operable to monitor only for the over-temperature or only for the over-power conditions, then the gain comparator 703 may be operable to select only gain $G_{PID2}(n)$ or only $G_{PID4}(n)$.

Figure 8:
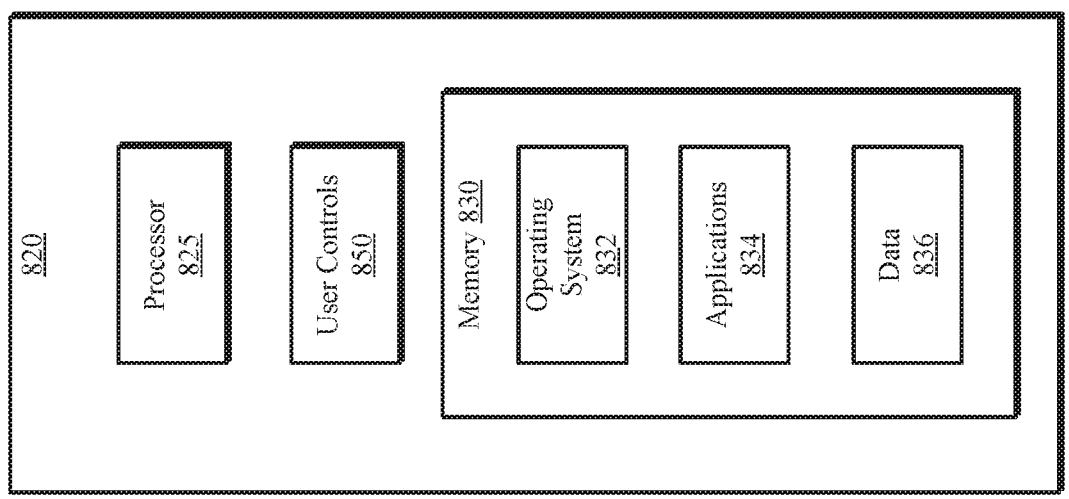
FIG. 8 is a block diagram of an exemplary hardware system for implementing the various embodiments of the present disclosure.

As discussed, the various techniques provided herein may be implemented by one or more systems which may include, in some embodiments, one or more subsystems and related components thereof. For example, FIG. 8 illustrates a block diagram of an example hardware system 800 in accordance with an embodiment of the disclosure. In this regard, system 800 may be used to implement any desired combination of the various blocks, processing, and operations described herein (e.g., feedback control system 200, feedback control system 300). Although a variety of components are illustrated in FIG. 8, components may be added and/or omitted for different types of devices as appropriate in various embodiments.

As shown, processing system 820 includes a processor 825, a memory 830, and user controls 850. Processor 825 may be implemented as one or more microprocessors, microcontrollers, application specific integrated circuits (ASICs), programmable logic devices (PLDs) (e.g., field programmable gate arrays (FPGAs), complex programmable logic devices (CPLDs), field programmable systems on a chip (FPSCs), or other types of programmable devices), codecs, and/or other processing devices.

In some embodiments, processor 825 may execute machine readable instructions (e.g., software, firmware, or other instructions) stored in memory 830. In this regard, processor 825 may perform any of the various operations, processes, and techniques described herein. For example, in some embodiments, the various processes and subsystems described herein (e.g., feedback control system 200, feedback control system 300) may be effectively implemented by processor 825 executing appropriate instructions. In other embodiments, processor 825 may be replaced and/or supplemented with dedicated hardware components to perform any desired combination of the various techniques described herein.

Memory 830 may be implemented as a machine readable medium storing various machine readable instructions and data. For example, in some embodiments, memory 830 may store an operating system 832 and one or more applications 834 as machine readable instructions that may be read and executed by processor 825 to perform the various techniques described herein. Memory 830 may also store data 836 used by operating system 832 and/or applications 834. In some embodiments, memory 830 may be implemented as non-volatile memory (e.g., flash memory, hard drive, solid state drive, or other non-transitory machine readable mediums), volatile memory, or combinations thereof. Thus, system 800 may be used to process feedback control algorithms in accordance with the various techniques described herein to provide temperature and power protection of loudspeakers using non-linear feedback controls.

Figure 9:
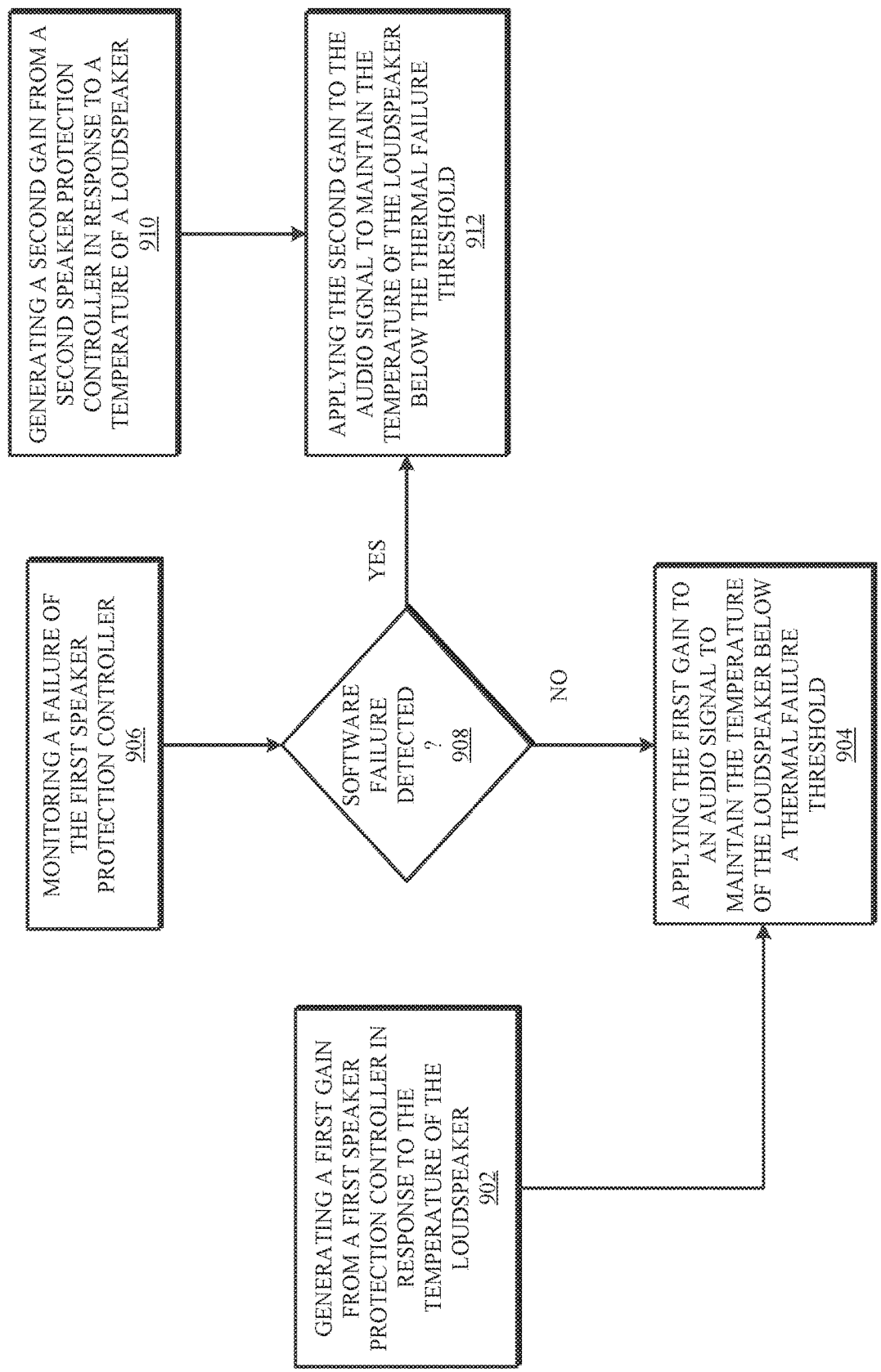
FIG. 9 is a flow diagram of an exemplary method according to one or more embodiments of the present disclosure.

An exemplary method of operation will now be described with reference to FIG. 9. In step 902, a first gain is generated from a first speaker protection controller in response to a temperature of a loudspeaker. In step 904, the first gain is applied to an audio signal to maintain the temperature of the loudspeaker below a thermal failure threshold. In one embodiment, the first speaker protection controller is implemented as a set of instructions stored in memory and configured to be executed by a general purpose processor, including computing the temperature of the loudspeaker based on the driving voltage or driving current, and comparing the temperature of the loudspeaker with a maximum temperature threshold determined for the loudspeaker. In one embodiment an error value is calculated as the difference between the maximum temperature threshold and the computed temperature, and the error value is used to generate the first gain. A second gain is generated in step 910 from a second speaker protection controller in response to the temperature of the loudspeaker. In step 906, the first speaker protection controller is monitored for a failure condition. In step 908, while no failure of the first speaker protection controller is detected, the first gain is applied to the audio signal via step 904. If a failure of the first speaker protection controller is detected, then the second gain is applied to the audio signal to maintain the temperature of the loudspeaker below the thermal failure threshold in step 912.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the present invention described herein may be implemented utilizing any suitable hardware, firmware (e.g. an application-specific integrated circuit), software, or a combination of software, firmware, and/or hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are exemplary only. One skilled in the art may recognize various alternative embodiments from those specifically disclosed. Those alternative embodiments are also intended to be within the scope of this disclosure. As such, the embodiments are limited only by the following claims and their equivalents.

What is claimed is:
1. A method comprising:
  generating a first gain from a first speaker protection controller comprising a processor configured to execute software instructions, the first gain generated in response to a driving signal of a loudspeaker, wherein the first gain reduces the driving signal when the driving signal exceeds a loudspeaker operational threshold;
applying the first gain to the driving signal to protect the loudspeaker during operation;
generating a second gain from a second speaker protection controller circuit comprising hardware components in response to the driving signal of the loudspeaker;
detecting a failure of the first speaker protection controller using a software failure detector; and
applying the second gain to the driving signal to protect the loudspeaker during operation when the failure of the first speaker protection controller is detected, the second gain generated by the hardware components of the second speaker protection controller circuit.

2. The method of claim 1, wherein the software instructions comprise a transducer state estimation module configured to instruct the processor to perform steps comprising:
computing a temperature of the loudspeaker based on a measured voltage and/or a measured current of the driving signal;
comparing the computed temperature of the loudspeaker with a maximum temperature of the loudspeaker to determine a first error value; and
generating the first gain when the first error value is negative to reduce a level of the driving signal.

3. The method of claim 2, wherein the first error value being negative is indicative of an over-temperature condition of the loudspeaker.

4. The method of claim 1, wherein the software instructions comprise a transducer state estimation module configured to instruct the processor to perform steps comprising:
computing a power of the loudspeaker based on a measured voltage and/or a measured current of the driving signal;
comparing the power of the loudspeaker with a maximum power of the loudspeaker to determine a second error value; and
generating the first gain when the second error value is negative to reduce a level of the driving signal.

5. The method of claim 1, wherein the first gain is generated by a first proportional-integral-derivative (PID) controller.

6. The method of claim 1, wherein the hardware components of the second speaker protection controller are configured to receive a measured power and/or a measured current of the driving signal and generate a first measured power for the driving signal.

7. The method of claim 1, wherein the first gain and the second gain are less than 1 when the driving signal exceeds the loudspeaker operational threshold; and
wherein the hardware components are configured to continually output a gain of one during operation of the first speaker protection controller and output the second gain when a failure of the first speaker protection controller is detected.

8. The method of claim 1, further comprising measuring a voltage of the driving signal, and wherein the first gain and the second gain are generated in response to the measured voltage.

9. The method of claim 1, further comprising measuring a current of the driving signal, and wherein the first gain and the second gain generated in response to the measured current.

10. A system comprising:
a first speaker protection controller comprising:
a memory storing instructions for the first speaker protection controller to generate a first gain to protect a loudspeaker during operation; and
a processor coupled to the memory and operable to execute the instructions to cause the system to perform operations comprising:
receiving a driving voltage of the loudspeaker;
computing a temperature of the loudspeaker based on the driving voltage;
comparing the temperature of the loudspeaker with a maximum temperature of the loudspeaker to determine an error value; and
generating the first gain if the error value is negative;
a second speaker protection controller comprising a plurality of hardware circuit components configured to generate a second gain in response to the driving voltage of the loudspeaker; and
a software failure detector configured to receive the first gain and the second gain, apply the first gain to an audio output signal when the first speaker protection controller is operable, and apply the second gain to the audio output signal when a failure is detected in the first speaker protection controller.

11. The system of claim 10 wherein the processor is further operable to execute the instructions comprising a transducer state estimation module configured to cause the system to perform operations comprising:
computing a power of the loudspeaker based on a measured driving current and a measured driving voltage of the loudspeaker;
comparing the computed power of the loudspeaker with a maximum power of the loudspeaker to determine a first error value; and
generating the first gain when the first error value is negative to reduce a level of the driving signal.

12. The system of claim 10, further comprising a voltage measurement component operable to measure the driving voltage of the loudspeaker.

13. The system of claim 10, wherein the second speaker protection controller further comprises a proportional-integral-derivative (PID) controller.

14. The system of claim 10, wherein the error value being negative is indicative of an over-temperature condition.

15. The system of claim 10, wherein the memory and processor are implemented in an audio codec.

16. The system of claim 10, wherein the plurality of hardware circuit components of the second speaker protection controller comprise hardware components configured to receive a measured power and/or a measured current of the driving signal and generate a plurality of measured powers for the driving signal; and
wherein the hardware components further comprise a multiplexer configured to receive the plurality of measured powers and output a selected one of the plurality of measured powers for use in generating the second gain.

17. The system of claim 10, wherein the second speaker protection controller is further operable to:
compute the temperature of the loudspeaker based on the driving voltage;
compare the temperature of the loudspeaker with a maximum temperature of the loudspeaker to determine an error value; and
generate the second gain in response to a negative error value.

18. The system of claim 10, wherein the second speaker protection controller is further operable to:

compute a power of the loudspeaker based on the driving voltage;

compare the power of the loudspeaker with a maximum power of the loudspeaker to determine an error value; and generate the second gain in response to a negative error value.

19. The method of claim 6, wherein the hardware components are further configured to receive the driving signal and generate a second measured power for the driving signal;

wherein the hardware components further comprise a multiplexer configured to receive the first measured power and the second measured power and output a selected one of the first measured power and the second measured power for use in generating the second gain.

20. The method of claim 19, wherein the hardware components further comprise:

a biquad filter configured to receive the output from the multiplexer and output a filtered measured power; and a component configured to receive a maximum power value for the loudspeaker and the filtered measure power and output an error signal;

wherein the second gain is generated based on the error signal.

\* \* \* \* \*